US012751314B2

(12) United States Patent
Chen et al.

(10) Patent No.: US 12,751,314 B2
(45) Date of Patent: Sep. 29, 2026

(54) DIE PACKAGE STRUCTURE AND METHOD FOR FORMING THE SAME

(71) Applicant: Winbond Electronics Corp., Taichung City (TW)

(72) Inventors: Yu-Cheng Chen, Kaohsiung City (TW); Jin-Neng Wu, Kaohsiung City (TW)

(73) Assignee: WINBOND ELECTRONICS CORP., Taichung City (TW)

( * ) Notice: Subject to any disclaimer, the term of this patent is extended or adjusted under 35 U.S.C. 154(b) by 677 days.

(21) Appl. No.: 18/168,434

(22) Filed: Feb. 13, 2023

(65) Prior Publication Data

US 2024/0274565 A1 Aug. 15, 2024

(51) Int. Cl.

| | |
|---|---|
| ***H10W 72/50*** | (2026.01) |
| ***H10W 70/09*** | (2026.01) |
| ***H10W 70/652*** | (2026.01) |
| ***H10W 72/00*** | (2026.01) |
| ***H10W 74/01*** | (2026.01) |
| ***H10W 74/10*** | (2026.01) |

(52) U.S. Cl.

CPC ......... *H10W 74/019* (2026.01); *H10W 72/50* (2026.01); *H10W 74/014* (2026.01); *H10W 74/147* (2026.01); *H10W 70/09* (2026.01); *H10W 70/6528* (2026.01); *H10W 72/0198* (2026.01); *H10W 74/141* (2026.01)

(58) Field of Classification Search

None

See application file for complete search history.

(56) References Cited

U.S. PATENT DOCUMENTS

| | | | | |
|---|---|---|---|---|
| 9,385,105 | B2 | 7/2016 | Meyer et al. | |
| 10,529,671 | B2 | 1/2020 | Lee et al. | |
| 2020/0313644 | A1* | 10/2020 | Inoue | H01L 23/04 |
| 2021/0020459 | A1 | 1/2021 | Shah et al. | |
| 2021/0082830 | A1 | 3/2021 | Lee et al. | |
| 2024/0038720 | A1* | 2/2024 | Um | H01L 25/0657 |
| 2024/0071996 | A1* | 2/2024 | Seo | H01L 24/45 |

* cited by examiner

*Primary Examiner* — Jay C Chang

(74) *Attorney, Agent, or Firm* — Birch, Stewart, Kolasch & Birch, LLP

(57) ABSTRACT

A method for forming a die package structure, including disposing a plurality of dies on a carrier substrate, wherein the top surface of each die has a plurality of signal junctions. The method also includes forming a vertical wire on each of the signal junctions, forming a supporting dielectric layer on the carrier substrate, wherein the supporting dielectric layer covers the dies and exposes the top of the vertical wires, and forming a plurality of redistribution traces on the supporting dielectric layer, wherein the redistribution traces are electrically connected to each of the vertical wires. The method further includes forming a bump at the bonding site of each of the redistribution traces, and performing a cutting process to singulate the dies.

9 Claims, 6 Drawing Sheets

DIE PACKAGE STRUCTURE AND METHOD FOR FORMING THE SAME

BACKGROUND OF THE INVENTION

Field of the Invention

The present disclosure relates to a method for forming a die package structure, and in particular to forming a bump on the die for flip chip bonding.

Description of the Related Art

A modern integrated circuit (IC) process generally includes several steps, such as fabricating an integrated circuit on a semiconductor wafer using various deposition processes, photolithography processes, and etching processes, and cutting out a plurality of semiconductor dies from the wafer and packaging the semiconductor dies. The main purpose of the packaging process is to protect the fragile semiconductor die and to interconnect the integrated circuit inside the semiconductor die with other semiconductor dies or external circuits.

After the fabrication of ICs, wafer FABs may cut semiconductor wafers into a plurality of semiconductor dies and ship them to their customers. In order to meet the requirements of flip chip packaging, sometimes it is necessary to form bumps and bump pads on a singulated die. Since existing methods and equipment are unable to form bumps and bump pads directly on a singulated die, the existing technology usually disposes the semiconductor dies on a carrier substrate and then performs an associated bumping process. It is difficult to control the warpage using the existing technology, and the process requires two carrier substrates at a high cost. Therefore, there is still a need to improve upon the existing technology.

BRIEF SUMMARY OF THE INVENTION

An embodiment of the present disclosure provides a method for forming a die package structure. The method includes disposing a plurality of dies on a carrier substrate, wherein a top surface of the dies each has a plurality of signal junctions. The method includes forming a vertical wire on each of the signal junctions. The method includes forming a supporting dielectric layer on the carrier substrate, wherein the supporting dielectric layer covers the dies and exposes a top of the vertical wire. The method includes forming a plurality of redistribution traces on the supporting dielectric layer, wherein the redistribution traces are electrically connected to each of the vertical wire. The method includes forming a bump at a bonding site of each of the redistribution traces. The method further includes performing a cutting process to singulate the dies.

Another embodiment of the present disclosure provides a die package structure. The die package structure includes a die with a plurality of signal junctions on a top surface of the die. The die package structure includes a plurality of vertical wires respectively forming over the signal junctions of the die. The die package structure includes a supporting dielectric layer covering the die and burying the vertical wires into the supporting dielectric layer, and exposing a top of the vertical wires. The die package structure includes a plurality of redistribution traces formed on the supporting dielectric layer and electrically connected to the vertical wires, respectively. The die package structure further includes a plurality of bumps formed at a bonding site of each of the redistribution traces, respectively.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE INVENTION

The embodiment of the present disclosure provides a method for forming a die package structure, which may form a bump or a bump pad required for a flip chip packaging process on a semiconductor die after cutting, and improve the issue of the warpage of the supporting dielectric layer formed in the intermediate process and reduce the related manufacturing cost.

Figure 1:
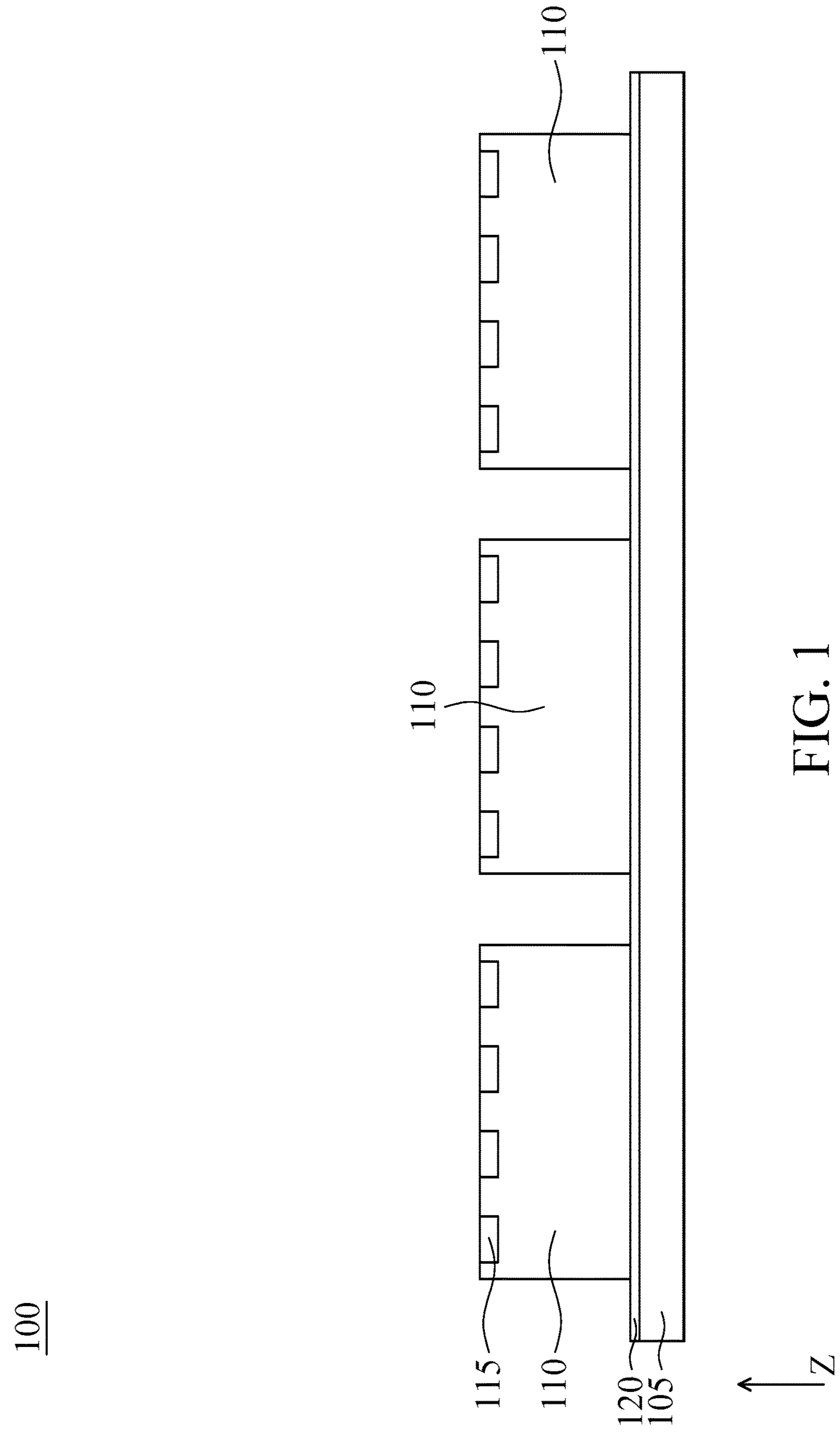
FIGS. 1 to 6 illustrate cross-sectional views at various stages of the die package structure according to the embodiment of the present disclosure.

FIG. 1 illustrates a cross-sectional view of a die package structure 100 with a plurality of dies 110 disposed on a carrier substrate 105, according to the embodiment of the present disclosure. In other words, the recontribute of the plurality of dies 110 on the carrier substrate 105 allows the plurality of dies 110 to continue the subsequent process in a near wafer form. In a conventional recontribute process, the dies are usually placed on the substrate in a face down manner, and are removed from the substrate after forming the supporting dielectric layer to continue the subsequent process. However, in the embodiment of the present disclosure, the dies 110 are placed on the carrier substrate 105 in a face up manner (e.g., facing the direction Z). That is, the dies 110 of the die package structure 100 have a plurality of signal junctions 115 exposed on the top surface, e.g., the dies 110 have a plurality of aluminum pads exposed on the top surface. The external circuits may be electrically connected to the integrated circuits inside the dies 110 by the signal junctions 115, for example by transmitting signals to and from the signal junctions 115. It should be understood that the number of signal junctions 115 illustrated in FIG. 1 is exemplary only and is not intended to be limited, and in other embodiments, dies 110 may have more than four or fewer signal junctions 115. In some embodiments, the top view shape of the signal junctions 115 may include a circle, a triangle, a rectangle, a diamond, or a square polygon. In some embodiments, the top surface of the carrier substrate 105 has an adhesive layer 120 which temporarily affixes the dies 110 to the carrier substrate 105, i.e., the adhesive layer 120 is in direct contact with the bottom surface of the dies 110. In some embodiments, the material of which the carrier substrate 105 is made may include glass, ceramic material, or another suitable material. In some embodiments, the material of the signal junctions 115 is aluminum. In other embodiments, the material of the signal junctions 115 may include copper, gold, nickel, palladium, an alloy thereof, or another conductive material.

Figure 2:
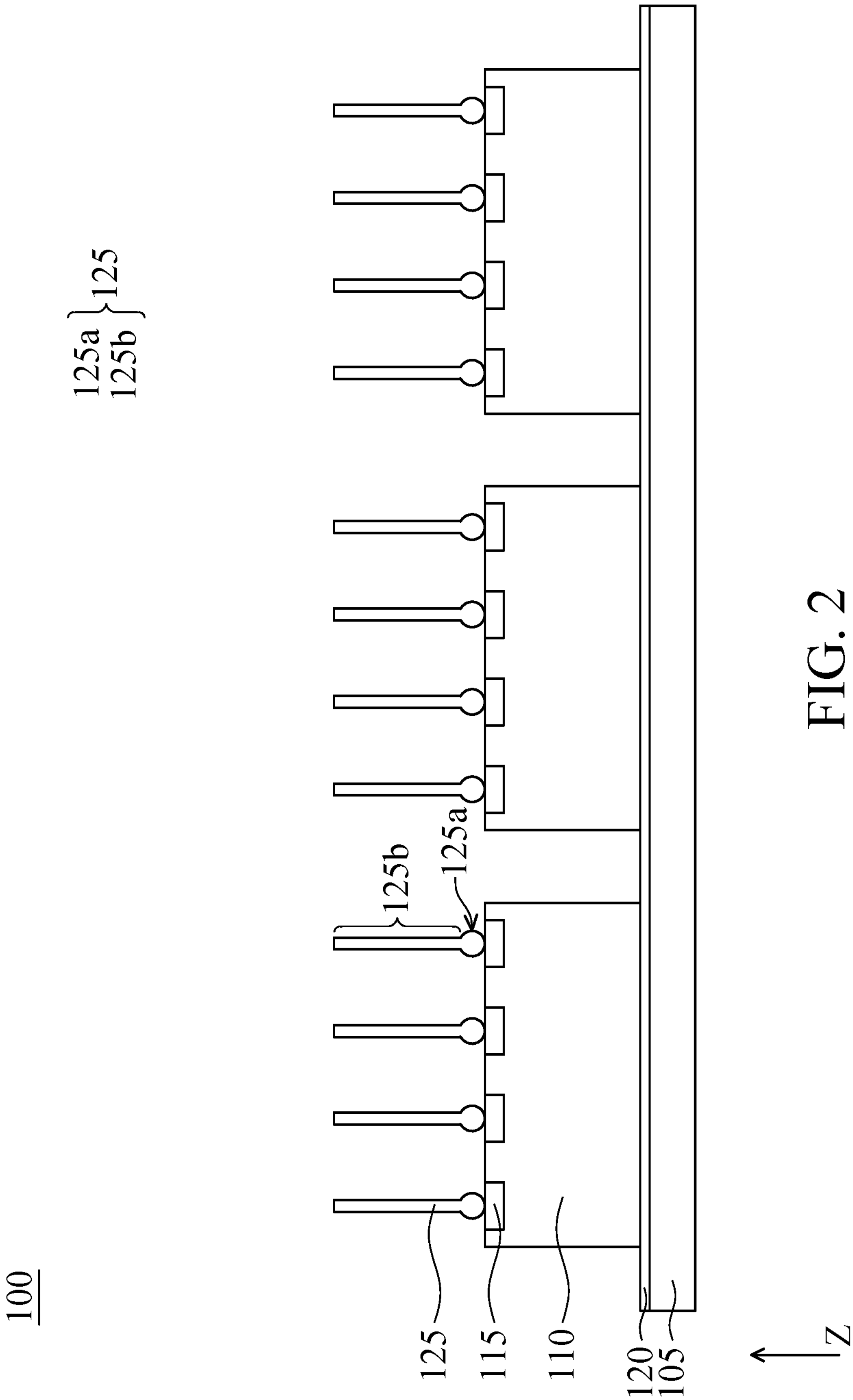

Next, referring to FIG. 2, vertical wires 125 are formed on each of the signal junctions 115 of the die package structure 100 such that the signal junctions 115 may be electrically connected to the external circuit by the vertical wires 125. In some embodiments, the step of forming the vertical wires 125 includes bonding a conductive material to each of the signal junctions 115 by a hot extrusion process and elongating the conductive material vertically upward in a direction away from the dies 110 to form the vertical wires 125. In some embodiments, after performing the hot extrusion process, the vertical wires 125 have a ball-shaped portion 125*a* in direct contact with each of the signal junctions 115, and the cross-sectional area of the ball-shaped portion 125*a* is greater than the cross-sectional area of an elongated portion 125*b* of the vertical wires 125. In some embodiments, the bottom area of the ball-shaped portion 125*a* is smaller than the top area of the signal junctions 115. In some embodiments, the hot extrusion process includes a thermosonic bonding process. In some embodiments, a length of the elongated portion 125*b* of the vertical wires 125 is elongated vertically upward between about 200 μm to about 300 μm. In some embodiments, the material of the vertical wires 125 may include copper, silver, gold, or a combination thereof.

Figure 3:
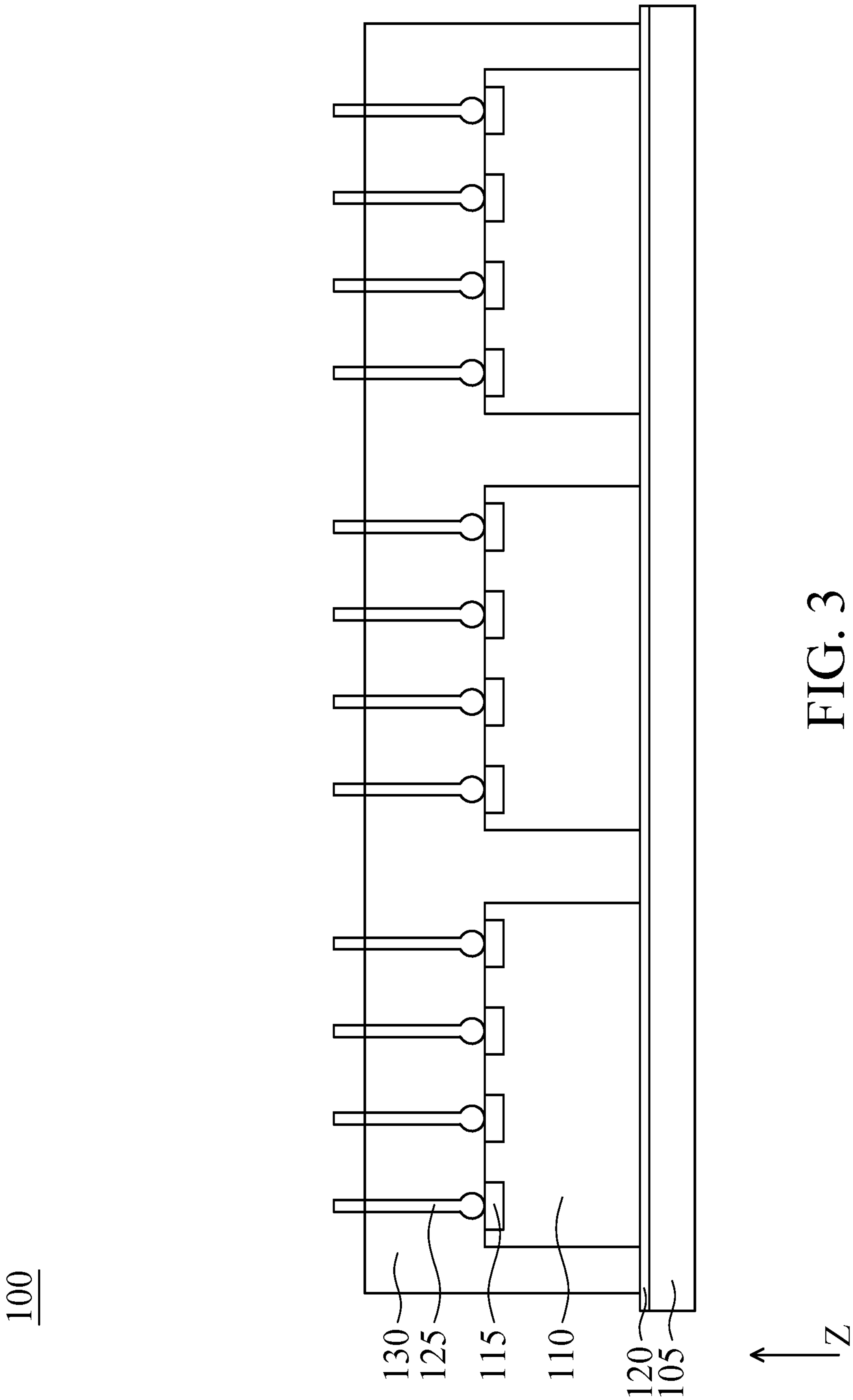

Referring to FIG. 3, a supporting dielectric layer 130 is formed on the carrier substrate 105, with the supporting dielectric layer 130 covering the dies 110 and exposing the top of the vertical wires 125, and with the vertical wires 125 buried into the supporting dielectric layer. The supporting dielectric layer 130 may be used to support other features that are subsequently formed on the top of the dies 110, so that the subsequently formed features do not overwhelm and damage the dies 110 and the vertical wires 125. In some embodiments, the supporting dielectric layer 130 is formed on the carrier substrate 105 by, for example, a molding process or another suitable method of forming a melted molding compound, followed by cooling and curing the melted molding compound to form the supporting dielectric layer 130. In some embodiments, the material of the supporting dielectric layer 130 may be a molding compound, such as an epoxy or another suitable resin.

Figure 4:
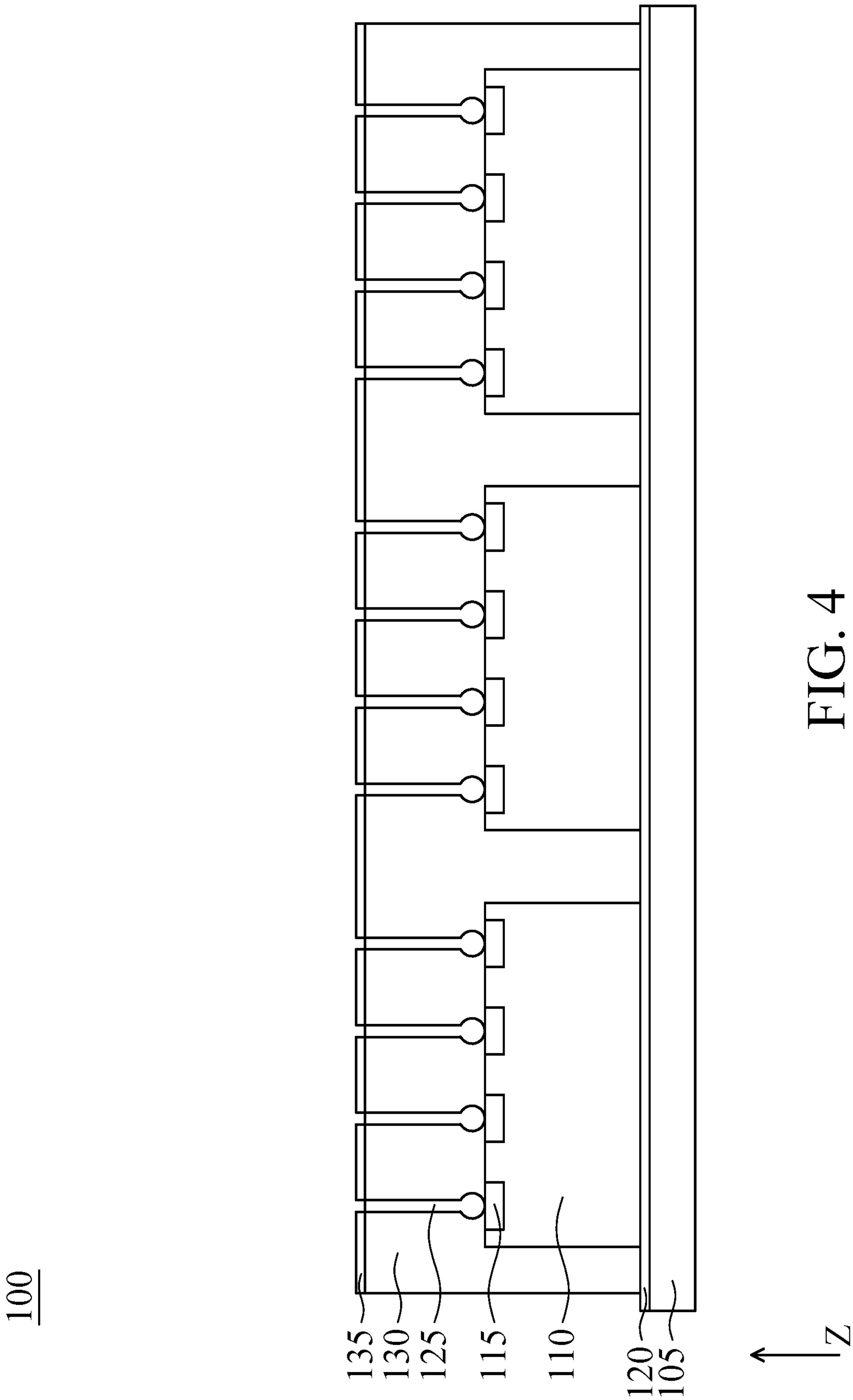

Then, referring to FIG. 4, after forming the supporting dielectric layer 130, a planarization process is performed so that the top surface of the vertical wires 125 is level with the top surface of the supporting dielectric layer 130. In some embodiments, after performing the planarization process, a first insulating layer 135 is formed on the supporting dielectric layer 130 and exposes the top surface of the vertical wires 125. The first insulating layer 135 defines an opening which exposes the top surface of the vertical wires 125 and facilitates the formation of the subsequent redistribution traces 140. In general, since the thermal expansion coefficient of the material of the first insulating layer 135 is lower than the thermal expansion coefficient of the material of the supporting dielectric layer 130, the first insulating layer 135 helps to reduce the warpage of the supporting dielectric layer 130 caused by heat during the subsequent formation of the redistribution traces 140. By forming the vertical wires 125 to a higher height first and then making the top surface of the vertical wires 125 level with the top surface of the supporting dielectric layer 130 through a planarization process, the inconsistent height of the vertical wires 125 may be avoided and may improve process yields. In some embodiments, the planarization process may include chemical mechanical polishing (CMP), mechanical grinding, or another suitable planarization process. In some embodiments, the first insulating layer 135 may be formed by chemical vapor deposition (CVD), atomic layer deposition (ALD), or another suitable process. In some embodiments, the material of the first insulating layer 135 may be polyimide (PI) or benzocyclobutene (BCB). In some embodiments, after the planarization process, the height of the vertical wires 125 may be between about 30 μm and about 50 μm, and the length of the elongated portion 125*b* of the vertical wires 125 may be between about 20 μm and about 30 μm.

Figure 5:
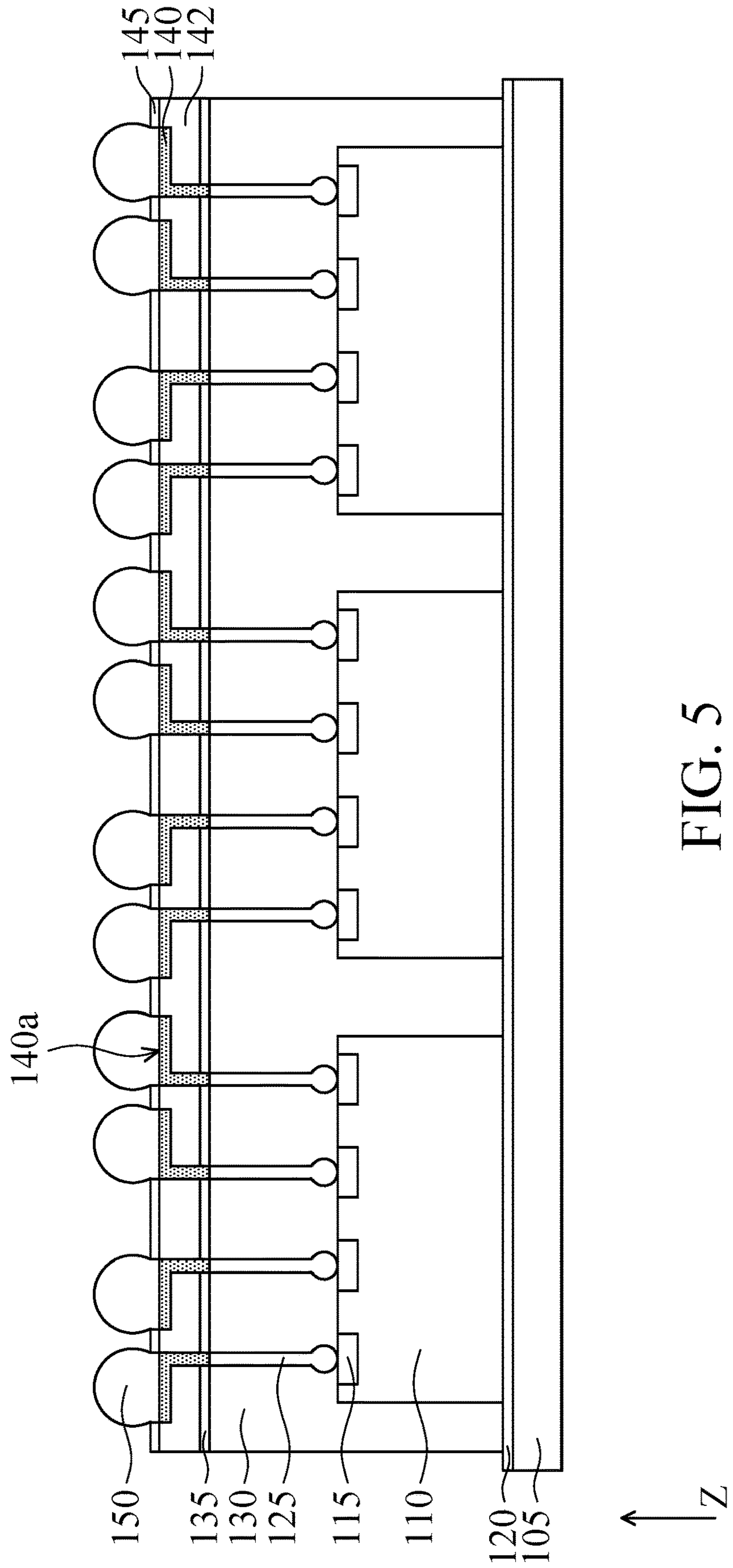

Referring to FIG. 5, after the planarization process, a plurality of redistribution traces 140 and a patterned dielectric layer 142 are formed on the supporting dielectric layer 130, and the redistribution traces 140 are electrically connected to each of the vertical wires 125. The redistribution traces 140 have bonding sites 140*a*, and the redistribution traces 140 may be disposed so that the dies 110 may have a fan-out design with more input/output (I/O) terminals. In some embodiments, a dielectric material layer may first be formed on the supporting dielectric layer 130, and a patterned dielectric layer 142 with openings for each of the vertical wires 125 may be formed by a photolithography process and an etching process. Then, a deposition process and/or an electroplating process are performed to form the redistribution traces 140 in the openings of the patterned dielectric layer 142. In some embodiments, the redistribution traces 140 are embedded in the patterned dielectric layer 142. In some embodiments, the material of the patterned dielectric layer 142 may be polyimide (PI) or benzocyclobutene (BCB). In some embodiments, the material of the redistribution traces 140 may include copper, gold, silver, or another suitable conductive material.

In the conventional process described above (with the die facing down), after affixing the reconstructed dies with the molding compound, the substrate used for the reconstructed dies is removed and the process of redistribution traces is carried out next. However, since the process of forming the redistribution traces is carried out at a relatively high temperature and the substrate used to carry the reconstructed dies has been removed, this makes the molding compound easily warp due to heat. In contrast, in the embodiment of the present disclosure, the supporting dielectric layer 130 is still disposed on the carrier substrate 105 during the formation of the redistribution traces 140. Since the carrier substrate 105 has a smaller thermal expansion coefficient, the carrier substrate 105 may reduce the warpage of the supporting dielectric layer 130 under high temperature environment.

Continuing with FIG. 5, after forming the redistribution traces 140, a second insulating layer 145 is formed on the redistribution traces 140 and exposes the bonding sites 140*a* of the redistribution traces 140 (e.g., a bonding pad for forming the bumps). The second insulating layer 145 may define the position of the subsequently formed bumps to avoid unnecessary short circuits between the bumps (i.e., adjacent redistribution traces 140). After forming the second insulating layer 145, the bumps 150 for the flip chip package are formed on the bonding sites 140*a* of each of the redistribution traces 140. In some embodiments, the second insulating layer 145 may be formed by chemical vapor deposition (CVD), atomic layer deposition (ALD), or another suitable process. In some embodiments, the bumps 150 are formed by a solder, which may include tin (Sn), lead (Pb), nickel (Ni), gold (Au), silver (Ag), copper (Cu), bismuth (Bi), and an alloy thereof. In some embodiments, the material of the second insulating layer 145 may be polyimide (PI) or benzocyclobutene (BCB).

Figure 6:
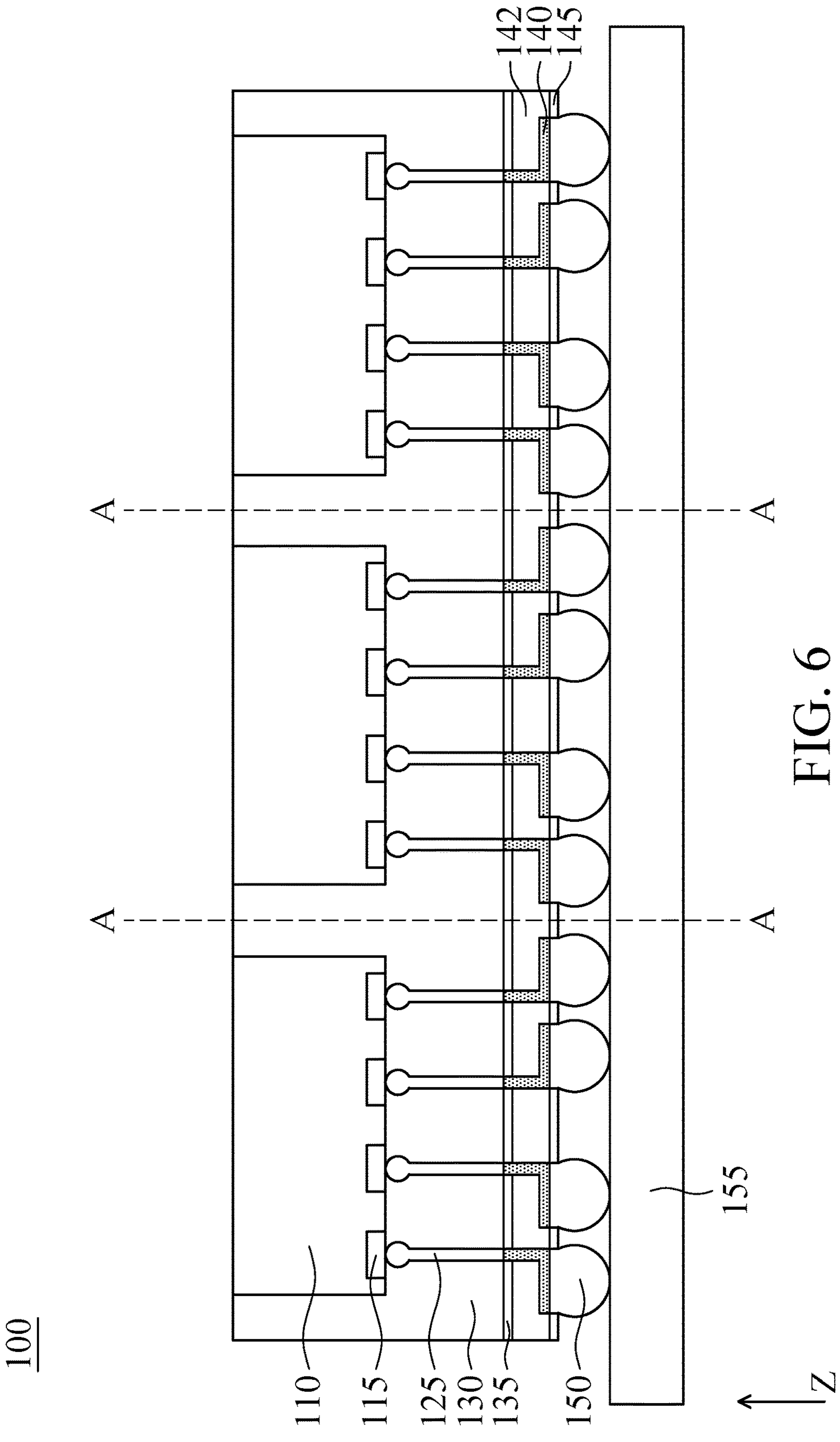

Referring to FIG. 6, after forming the bumps 150, the carrier substrate 105 is turned upside down and transferred to an adhesive substrate 155, so that the bumps 150 are in direct contact with the adhesive substrate 155 and the bumps 150 are temporarily affixed to the adhesive substrate 155.

Next, the carrier substrate 105 is removed to expose the bottom surface of the dies 110, and a cutting process is performed to singulate the plurality of the dies 110 from each other along a plurality of cutting lines A-A resulting in dies 110 with a bump structure.

After the cutting process is performed, the dies 110 with the bumps 150 and the fan-out redistribution traces 140 may continue with the flip chip packaging process, such as interconnecting the dies 110 with other dies or external circuits, which is not further described herein.

In summary, the embodiment of the present disclosure provides a process for forming the bumps on the dies. By temporarily disposing a plurality of dies on a carrier substrate, and forming redistribution traces and bumps after connecting the signal junctions of the dies by vertical wires, the effect of warpage of the material of the supporting dielectric layer (e.g., a molding compound) due to heat may be effectively reduced compared to the method of simply using a supporting dielectric layer to affix the dies and then performing the related process. It will be understood that not all advantages have been necessarily discussed herein, no particular advantage is required for all embodiments, and other embodiments may offer different advantages.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A die package structure, comprising:

a die with a plurality of signal junctions on a top surface of the die;

a plurality of vertical wires formed over the signal junctions of the die, respectively;

a supporting dielectric layer covering the die and burying the vertical wires into the supporting dielectric layer, and exposing a top of the vertical wires;

a first insulating layer disposed on the supporting dielectric layer and exposing a top surface of the vertical wires, wherein a thermal expansion coefficient of the supporting dielectric layer is greater than a thermal expansion coefficient of the first insulating layer;

a plurality of redistribution traces formed on the first insulating layer and electrically connected to the vertical wires, respectively;

a plurality of bumps formed at a bonding site of each of the redistribution traces, respectively;

a patterned dielectric layer disposed on the first insulating layer, wherein the redistribution traces are embedded in the patterned dielectric layer; and a second insulating layer disposed on the patterned dielectric layer and exposing the bonding sites of the redistribution traces, wherein the die comprises at least two signal junctions, at least two vertical wires, at least two redistribution traces, and at least two bumps.

2. The die package structure as claimed in claim 1, wherein the vertical wires each has a ball-shaped portion in direct contact with each of the signal junctions and an elongated portion extending vertically upward away from the die.

3. The die package structure as claimed in claim 2, wherein a cross-sectional area of the ball-shaped portion is greater than a cross-sectional area of the elongated portion.

4. The die package structure as claimed in claim 2, wherein a bottom area of the ball-shaped portion is smaller than a top area of the signal junctions.

5. The die package structure as claimed in claim 1, wherein a material of the bumps comprises Sn, Pb, Ni, Au, Ag, Cu, Bi, and an alloy thereof.

6. The die package structure as claimed in claim 1, wherein a height of the vertical wires is between 30 μm to 50 μm.

7. The die package structure as claimed in claim 1, wherein a material of the supporting dielectric layer comprises molding compound.

8. The die package structure as claimed in claim 1, wherein a material of the vertical wires comprises copper, silver, gold, or a combination thereof.

9. The die package structure as claimed in claim 1, wherein a top surface of the vertical wires is level with a top surface of the supporting dielectric layer.

* * * * *